United States Patent
Yin et al.

(10) Patent No.: US 8,549,374 B2
(45) Date of Patent: Oct. 1, 2013

(54) DUAL REED-MULLER (RM) CODE SEGMENTATION FOR UPLINK CONTROL INFORMATION (UCI)

(75) Inventors: Zhanping Yin, Vancouver, WA (US); Shohei Yamada, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 337 days.

(21) Appl. No.: 13/026,073

(22) Filed: Feb. 11, 2011

(65) Prior Publication Data
US 2012/0210187 A1 Aug. 16, 2012

(51) Int. Cl.
*H03M 13/00* (2006.01)
(52) U.S. Cl.
USPC ........... 714/751; 714/752; 714/786; 370/329; 370/335
(58) Field of Classification Search
USPC .................. 714/751, 752, 786; 370/329, 335
See application file for complete search history.

(56) References Cited

U.S. PATENT DOCUMENTS

| | | | |
|---|---|---|---|
| 6,877,131 B2* | 4/2005 | Kim et al. | 714/790 |
| 7,043,676 B2* | 5/2006 | Kim | 714/752 |
| 7,333,546 B2* | 2/2008 | Kim et al. | 375/242 |
| 7,404,138 B2* | 7/2008 | Kim et al. | 714/776 |
| 7,447,190 B2* | 11/2008 | Kim | 370/342 |
| 7,721,179 B2* | 5/2010 | Kim et al. | 714/755 |
| 8,301,962 B2* | 10/2012 | Kim | 714/753 |

OTHER PUBLICATIONS

3GPP TS 36.212 V9.0.0, "Evolved Universal Terrestrial Radio Access (E-UTRA); Multiplexing and Channel Coding (Release 9)," Dec. 2009.
3GPP TS 36.211 V9.0.0, "Evolved Universal Terrestrial Radio Access (E-UTRA); Physical Channels and Modulation (Release 9)," Dec. 2009.

* cited by examiner

*Primary Examiner* — Esaw Abraham
(74) *Attorney, Agent, or Firm* — Austin Rapp & Hardman

(57) ABSTRACT

A method for reporting uplink control information (UCI) on a user equipment (UE) is described. It is determined a number of bits in a sequence of bits for transmission is greater than 11 and less than or equal to 21. The sequence of bits for transmission is segmented into a first segment and a second segment using a floor function. The first segment is encoded using a first Reed-Muller encoder. The second segment is encoded using a second Reed-Muller encoder.

24 Claims, 9 Drawing Sheets

DUAL REED-MULLER (RM) CODE SEGMENTATION FOR UPLINK CONTROL INFORMATION (UCI)

TECHNICAL FIELD

The present invention relates generally to wireless communications and wireless communications-related technology. More specifically, the present invention relates to systems and methods for dual Reed-Muller (RM) code segmentation for uplink control information (UCI).

BACKGROUND

Wireless communication devices have become smaller and more powerful in order to meet consumer needs and to improve portability and convenience. Consumers have become dependent upon wireless communication devices and have come to expect reliable service, expanded areas of coverage and increased functionality. A wireless communication system may provide communication for a number of cells, each of which may be serviced by a base station. A base station may be a fixed station that communicates with mobile stations.

Various signal processing techniques may be used in wireless communication systems to improve efficiency and quality of wireless communication. In Rel-10, multiple component carriers (CCs) or cells were introduced. The use of multiple component carriers (CCs) or cells may increase the amount of uplink control information (UCI) generated by a wireless communication device. Benefits may be realized by improved methods for reporting uplink control information (UCI) by a wireless communication device.

DETAILED DESCRIPTION

Figure 1:
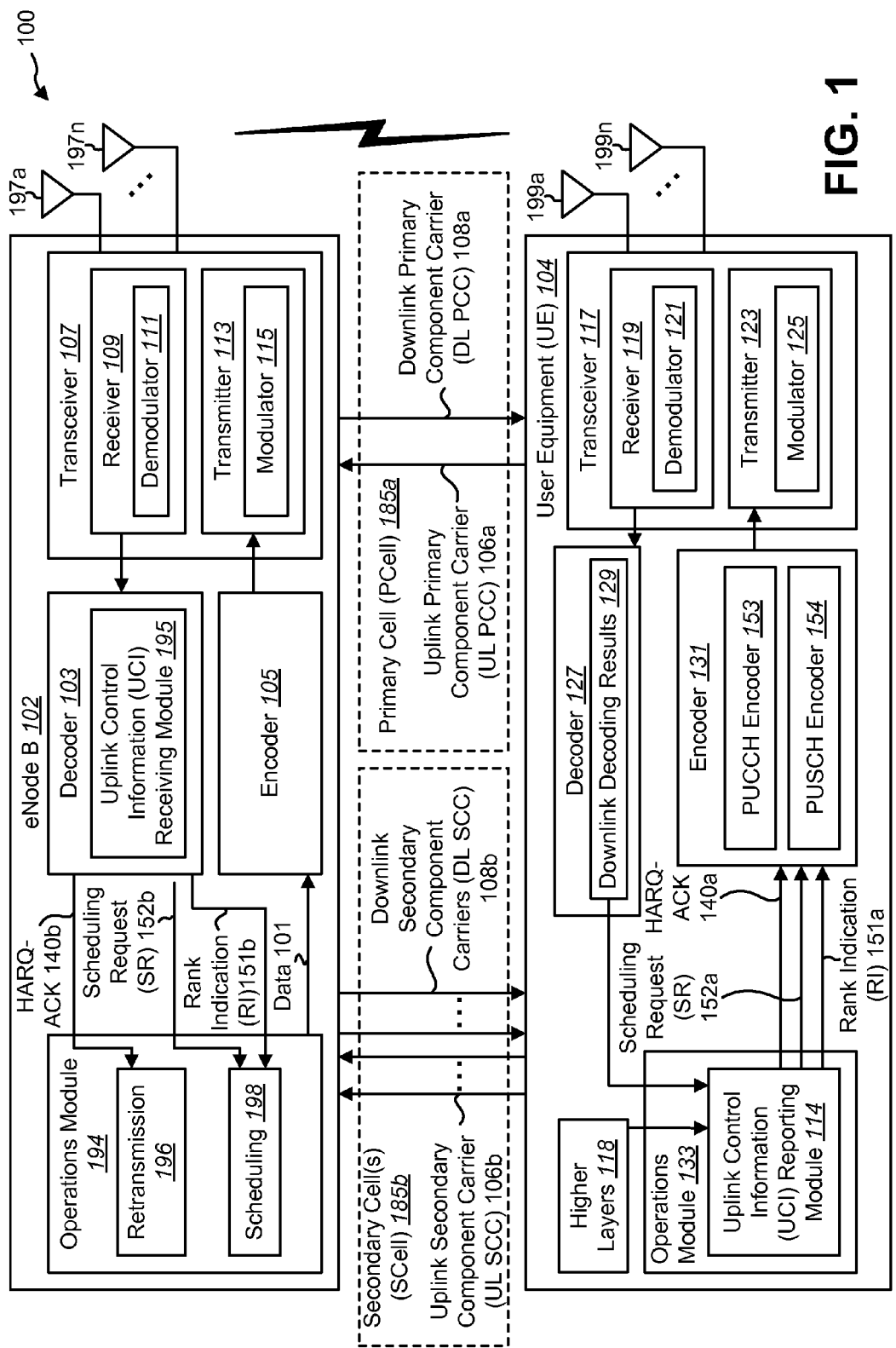
FIG. 1 is a block diagram illustrating a wireless communication system using uplink control information (UCI) multiplexing.

A method for reporting uplink control information (UCI) on a user equipment (UE) is described. The method includes determining that a number of bits in a sequence of bits for transmission is greater than 11 and less than or equal to 21. The sequence of bits for transmission is segmented into a first segment and a second segment using a floor function. The first segment is encoded using a first Reed-Muller encoder. The second segment is encoded using a second Reed-Muller encoder.

The encoded first segment and the encoded second segment may be transmitted on the physical uplink control channel (PUCCH), on the physical uplink shared channel (PUSCH) or both. The sequence of bits for transmission may include a concatenated sequence of hybrid automatic repeat request acknowledgement (HARQ-ACK) bits. A scheduling request (SR) may coincide with the transmission of a sequence of concatenated hybrid automatic repeat request acknowledgement (HARQ-ACK) bits. The scheduling request (SR) may be appended at the end of the sequence of concatenated HARQ-ACK bits to obtain the sequence of bits for transmission.

The encoded first segment and the encoded second segment may be transmitted to an eNode B using physical uplink control channel (PUCCH) Format 3. A bit error rate of the scheduling request (SR) may be greater than a bit error rate of the HARQ-ACK bits. A sequence of concatenated hybrid automatic repeat request acknowledgement (HARQ-ACK) bits may be received from higher layers for each subframe of each cell.

A method for reporting uplink control information (UCI) on a user equipment (UE) is also described. The method includes determining that a number of bits in a sequence of bits for transmission is greater than 11 and less than or equal to 21. The sequence of bits for transmission is segmented into a first segment and a second segment using a ceiling function. The first segment is encoded using a first Reed-Muller encoder. The second segment is encoded using a second Reed-Muller encoder. The encoded first segment and the encoded second segment are rate matched and multiplexed.

The sequence of bits for transmission may include a sequence of concatenated hybrid automatic repeat request acknowledgement (HARQ-ACK) bits. The sequence of bits for transmission may instead include a sequence of concatenated rank indication (RI) bits. The encoded first segment and the encoded second segment may be transmitted on the physical uplink shared channel (PUSCH) after rate matching and multiplexing the encoded first segment and the encoded second segment.

A user equipment (UE) configured for reporting uplink control information (UCI) is described. The user equipment (UE) includes a processor, memory in electronic communication with the processor and instructions stored in the memory. The instructions are executable by the processer to determine that a number of bits in a sequence of bits for transmission is greater than 11 and less than or equal to 21. The instructions are also executable by the processor to segment the sequence of bits for transmission into a first segment and a second segment using a floor function. The instructions are further executable by the processor to encode the first segment using a first Reed-Muller encoder. The instructions are also executable by the processor to encode the second segment using a second Reed-Muller encoder.

A user equipment (UE) configured for reporting uplink control information (UCI) is also described. The user equipment (UE) includes a processor, memory in electronic communication with the processor and instructions stored in the memory. The instructions are executable by the processor to determine that a number of bits in a sequence of bits for transmission is greater than 11 and less than or equal to 21. The instructions are also executable by the processor to segment the sequence of bits for transmission into a first segment and a second segment using a ceiling function. The instructions are further executable by the processor to encode the first segment using a first Reed-Muller encoder. The instructions are also executable by the processor to encode the second segment using a second Reed-Muller encoder. The instructions are further executable by the processor to rate match and multiplex the encoded first segment and the encoded second segment.

The 3rd Generation Partnership Project, also referred to as "3GPP," is a collaboration agreement that aims to define globally applicable technical specifications and technical reports for third and fourth generation wireless communication systems. The 3GPP may define specifications for the next generation mobile networks, systems and devices.

3GPP Long Term Evolution (LTE) is the name given to a project to improve the Universal Mobile Telecommunications System (UMTS) mobile phone or device standard to cope with future requirements. In one aspect, UMTS has been modified to provide support and specification for the Evolved Universal Terrestrial Radio Access (E-UTRA) and Evolved Universal Terrestrial Radio Access Network (E-UTRAN).

At least some aspects of the systems and methods disclosed herein may be described in relation to the 3GPP LTE and LTE-Advanced standards (e.g., Release-8, Release-9 and Release-10). However, the scope of the present disclosure should not be limited in this regard. At least some aspects of the systems and methods disclosed herein may be utilized in other types of wireless communication systems.

FIG. 1 is a block diagram illustrating a wireless communication system 100 using uplink control information (UCI) multiplexing. An eNode B 102 may be in wireless communication with one or more user equipments (UEs) 104. An eNode B 102 may be referred to as an access point, a Node B, a base station or some other terminology. Likewise, a user equipment (UE) 104 may be referred to as a mobile station, a subscriber station, an access terminal, a remote station, a user terminal, a terminal, a handset, a subscriber unit, a wireless communication device or some other terminology.

Communication between a user equipment (UE) 104 and an eNode B 102 may be accomplished using transmissions over a wireless link, including an uplink and a down link. The uplink refers to communications sent from a user equipment (UE) 104 to an eNode B 102. The down link refers to communications sent from an eNode B 102 to a user equipment (UE) 104. The communication link may be established using a single-input and single-output (SISO), multiple-input and single-output (MISO), single-input and multiple-output (SIMO) or a multiple-input and multiple-output (MIMO) system. A MIMO system may include both a transmitter and a receiver equipped with multiple transmit and receive antennas. Thus, an eNode B 102 may have multiple antennas 197a-n and a user equipment (UE) 104 may have multiple antennas 199a-n. In this way, the eNode B 102 and the user equipment (UE) 104 may each operate as either a transmitter or a receiver in a MIMO system. One benefit of a MIMO system is improved performance if the additional dimensionalities created by the multiple transmit and receive antennas are utilized.

The user equipment (UE) 104 communicates with an eNode B 102 using one or more antennas 199a-n. The user equipment (UE) 104 may include a transceiver 117, a decoder 127, an encoder 131 and an operations module 133. The transceiver 117 may include a receiver 119 and a transmitter 123. The receiver 119 may receive signals from the eNode B 102 using one or more antennas 199a-n. For example, the receiver 119 may receive and demodulate received signals using a demodulator 121. The transmitter 123 may transmit signals to the eNode B 102 using one or more antennas 199a-n. For example, the transmitter 123 may modulate signals using a modulator 125 and transmit the modulated signals.

The receiver 119 may provide a demodulated signal to the decoder 127. The user equipment (UE) 104 may use the decoder 127 to decode signals and make downlink decoding results 129. The downlink decoding results 129 may indicate whether data was received correctly. For example, the downlink decoding results 129 may indicate whether a packet was correctly or erroneously received (i.e., positive acknowledgement, negative acknowledgement or discontinuous transmission (no signal)).

The operations module 133 may be a software and/or hardware module used to control user equipment (UE) 104 communications. For example, the operations module 133 may determine when the user equipment (UE) 104 requires resources to communicate with an eNode B 102. The operations module 133 may receive instructions from higher layers 118.

In $3^{rd}$ Generation Partnership Project (3GPP) Long Term Evolution (LTE)—Advanced (LTE-A), additional control feedback will have to be sent on control channels to accommodate MIMO and carrier aggregation. Carrier aggregation refers to transmitting data on multiple component carriers (CCs) or cells that are contiguously or separately located. Both the hybrid automatic repeat and request (ARQ) acknowledgement (HARQ-ACK) with positive-acknowledge and negative-acknowledge (ACK/NACK) bits and other control information may be transmitted using the physical uplink control channel (PUCCH) and/or the physical uplink shared channel (PUSCH). In carrier aggregation (CA), only one uplink component carrier (CC) or cell may be utilized for transmission of control information. In LTE-A, component carriers (CCs) are referred to as cells.

The user equipment (UE) 104 may transmit uplink control information (UCI) to an eNode B 102 on the uplink. The uplink control information (UCI) may include a channel quality indicator (CQI), a precoding matrix indicator (PMI), rank indication (RI) 151a, a scheduling request (SR) 152a and a hybrid automatic repeat request acknowledgement (HARQ-ACK) 140a. HARQ-ACK 140a means ACK (positive-acknowledgement) and/or NACK (negative-acknowledgement) and/or DTX (discontinuous transmission) responses for HARQ operation, also known as ACK/NACK. If a transmission is successful, the HARQ-ACK 140a may have a logical value of 1 and if the transmission is unsuccessful, the HARQ-ACK 140a may have a logical value of 0.

The uplink control information (UCI) may be transmitted on either the physical uplink control channel (PUCCH) or the physical uplink shared channel (PUSCH). The uplink control information (UCI) may be reported from a user equipment (UE) 104 to an eNode B 102 either periodically or aperiodically.

The HARQ-ACK 140a, the scheduling request (SR) 152a and the rank indication (RI) 151a may be generated by the uplink control information (UCI) reporting module 114 and transferred to an encoder 131. The encoder 131 may include a physical uplink control channel (PUCCH) encoder 153 and a physical uplink shared channel (PUSCH) encoder 154. The physical uplink control channel (PUCCH) encoder 153 may receive the HARQ-ACK 140a and the scheduling request (SR) 152a. The physical uplink shared channel (PUSCH) encoder 154 may receive the HARQ-ACK 140a and the rank indication (RI) 151a. The encoder 131 may generate uplink control information (UCI) using backwards compatible physical uplink control channel (PUCCH) formats and physical uplink shared channel (PUSCH) formats. Backwards compatible physical uplink control channel (PUCCH) formats are those formats that may be used by Release-10 user equipments (UEs) 104 as well as Release-8/9 user equipments (UEs) 104.

The user equipment (UE) 104 may also transmit a reference signal (RS) to an eNode B 102. The uplink control information (UCI) may be transmitted using the physical uplink control channel (PUCCH) and/or the physical uplink shared channel (PUSCH). One or more physical uplink control channel (PUCCH) reference signal (RS) symbols are included in a physical uplink control channel (PUCCH) signal transmission on each slot.

The time and frequency resources may be quantized to create a grid known as the Time-Frequency grid. In the time domain, 10 milliseconds (ms) is referred to as one radio frame. One radio frame may include 10 subframes, each with a duration of 1 ms, which is the duration of transmission in the uplink and/or downlink. Every subframe may be divided into two slots, each with a duration of 0.5 ms. Each slot may be divided into 7 symbols. The frequency domain may be divided into bands with a 15 kilohertz (kHz) width, referred to as a subcarrier. One resource element has a duration of one symbol in the time domain and the bandwidth of one subcarrier in the frequency domain.

The minimum amount of resource that can be allocated for the transmission of information in the uplink or downlink in any given subframe is two resource blocks (RBs), one RB at each slot. One RB has a duration of 0.5 ms (7 symbols or one slot) in the time domain and a bandwidth of 12 subcarriers (180 kHz) in the frequency domain. At any given subframe, a maximum of two RBs (one RB at each slot) can be used by a given user equipment (UE) 104 for the transmission of uplink control information (UCI) in the physical uplink control channel (PUCCH).

In LTE Release-8, only one uplink component carrier (CC) 106 or cell 185 and one downlink component carrier (CC) 108 or cell 185 can be used for transmission to and reception from each user equipment (UE) 104. The uplink control information (UCI) such as ACK/NACK bits for hybrid ARQ (HARQ) 140a and periodic channel quality indicators (CQI), periodic precoding matrix indicator (PMI) and periodic rank indication (RI) 151a can be sent on the physical uplink control channel (PUCCH), on the physical uplink shared channel (PUSCH) or on both.

In 3GPP Long Term Evolution (LTE) Release-10 (LTE-A or Advanced EUTRAN), carrier aggregation was introduced. Carrier aggregation may also be referred to as cell aggregation. Carrier aggregation is supported in both the uplink and the downlink with up to five component carriers (CCs) 106, 108, also known as cells 185. Each component carrier (CC) 106, 108 or cell 185 may have a transmission bandwidth of up to 110 resource blocks (i.e., up to 20 megahertz (MHz)). In carrier aggregation, two or more component carriers (CCs) 106, 108 or cells 185 are aggregated to support wider transmission bandwidths up to one hundred megahertz (MHz). A user equipment (UE) 104 may simultaneously receive and/or transmit on one or multiple component carriers (CCs) 106, 108 or cells 185, depending on the capabilities of the user equipment (UE) 104.

A user equipment (UE) 104 may communicate with an eNode B 102 using multiple component carriers (CCs) 108 or cells 185 at the same time. For example, a user equipment (UE) 104 may communicate with an eNode B 102 using a primary cell (PCell) 185a while simultaneously communicating with the eNode B 102 using secondary cell(s) (SCell) 185b. Similarly, an eNode B 102 may communicate with a user equipment (UE) 104 using multiple component carriers (CCs) 108 or cells 185 at the same time. For example, an eNode B 102 may communicate with a user equipment (UE) 104 using a primary cell (PCell) 185a while simultaneously communicating with the user equipment (UE) 104 using secondary cell(s) (SCell) 185b.

An eNode B 102 may include a transceiver 107 that includes a receiver 109 and a transmitter 113. An eNode B 102 may additionally include a decoder 103, an encoder 105 and an operations module 194. An eNode B 102 may receive uplink control information (UCI) using its one or more antennas 197a-n and its receiver 109. The receiver 109 may use the demodulator 111 to demodulate the uplink control information (UCI).

The decoder 103 may include an uplink control information (UCI) receiving module 195. An eNode B 102 may use the uplink control information (UCI) receiving module 195 to decode and interpret the uplink control information (UCI) received by the eNode B 102. The eNode B 102 may use the decoded uplink control information (UCI) to perform certain operations, such as retransmit one or more packets based on scheduled communication resources for the user equipment (UE) 104. The uplink control information (UCI) may include a rank indication (RI) 151b, a scheduling request (SR) 152b and/or an HARQ-ACK 140b.

The operations module 194 may include a retransmission module 196 and a scheduling module 198. The retransmission module 196 may determine which packets to retransmit (if any) based on the uplink control information (UCI). The scheduling module 198 may be used by the eNode B 102 to schedule communication resources (e.g., bandwidth, time slots, frequency channels, spatial channels, etc.). The scheduling module 198 may use the uplink control information (UCI) to determine whether (and when) to schedule communication resources for the user equipment (UE) 104.

The operations module 194 may provide data 101 to the encoder 105. For example, the data 101 may include packets for retransmission and/or a scheduling grant for the user equipment (UE) 104. The encoder 105 may encode the data 101, which may then be provided to the transmitter 113. The transmitter 113 may modulate the encoded data using the modulator 115. The transmitter 113 may transmit the modulated data to the user equipment (UE) 104 using one or more antennas 197a-n.

When carrier aggregation is configured, a user equipment (UE) 104 may have only one radio resource control (RRC) connection with the network. At the radio resource control (RRC) connection establishment/re-establishment/handover, one serving cell 185 (i.e., the primary cell (PCell) 185a) provides the non-access stratum (NAS) mobility information (e.g., Tracking Area Identity (TAI)) and the security input.

In the downlink, the component carrier (CC) 108 corresponding to the primary cell (PCell) 185a is the downlink primary component carrier (DL PCC) 108a. In the uplink, the component carrier (CC) 106 corresponding to the primary cell (PCell) 185a is the uplink primary component carrier (UL PCC) 106a. Depending on the capabilities of the user equipment (UE) 104, one or more secondary component carriers (SCC) 106b, 108b or secondary cells (SCell) 185b may be configured to form a set of serving cells with the primary cell (PCell) 185a. In the downlink, the component carrier (CC) 108 corresponding to the secondary cell (SCell) 185b is the downlink secondary component carrier (DL SCC) 108b. In the uplink, the component carrier (CC) 106 corresponding to the secondary cell (SCell) 185b is the uplink secondary component carrier (UL SCC) 106b. The number of downlink component carriers (CCs) 108 or cells 185 may be different from the number of uplink component carriers (CCs) 106 or cells 185 because multiple user equipments (UEs) 104 may share one uplink component carrier (CC) 106.

In LTE-A, the component carriers (CCs) 106, 108 are referred to as cells 185. If carrier aggregation is configured, a user equipment (UE) 104 may have multiple serving cells: a primary cell (PCell) 185*a* and one or more secondary cells (SCell) 185*b*. From a network perspective, the same serving cell 185 may be used as the primary cell (PCell) 185*a* by one user equipment (UE) 104 and used as a secondary cell (SCell) 185*b* by another user equipment (UE) 104. A primary cell (PCell) 185*a* that is operating according to Release-8/9 is equivalent to the Release-8/9 serving cell. When operating according to Release-10, there may be one or more secondary cells (SCell) 185*b* in addition to the primary cell (PCell) 185*a* if carrier aggregation is configured.

A number of spatial channels may be available on each serving cell 185 by using multiple antennas at a transmitter and a receiver. Therefore, multiple codewords (up to two codewords) may be transmitted simultaneously. If the user equipment (UE) 104 is configured with five component carriers (CCs) 106, 108 or cells 185 and two codewords for each of the component carriers (CCs) 106, 108 or cells 185, ten HARQ-ACK 140 acknowledgement/negative acknowledgement (ACK/NACK) bits for a single downlink subframe may be generated by the user equipment (UE) 104 in frequency division duplex (FDD) systems. In time division duplex (TDD) systems, a downlink assignment index (DAI) may be used to indicate the number of subframes with a physical downlink shared channel (PDSCH) transmission. Therefore, the HARQ-ACK 140 acknowledgement/negative acknowledgement (ACK/NACK) bits of multiple subframes may be reported in one feedback. The HARQ-ACK acknowledgement/negative acknowledgement (ACK/NACK) bits for a single uplink feedback generated by the user equipment (UE) 104 may be more than 10 bits (e.g., up to 20 bits or 40 bits). One benefit of using carrier aggregation is that additional downlink and/or uplink data may be transmitted. As a result of the additional downlink data, additional uplink control information (UCI) may be needed.

Figure 2:
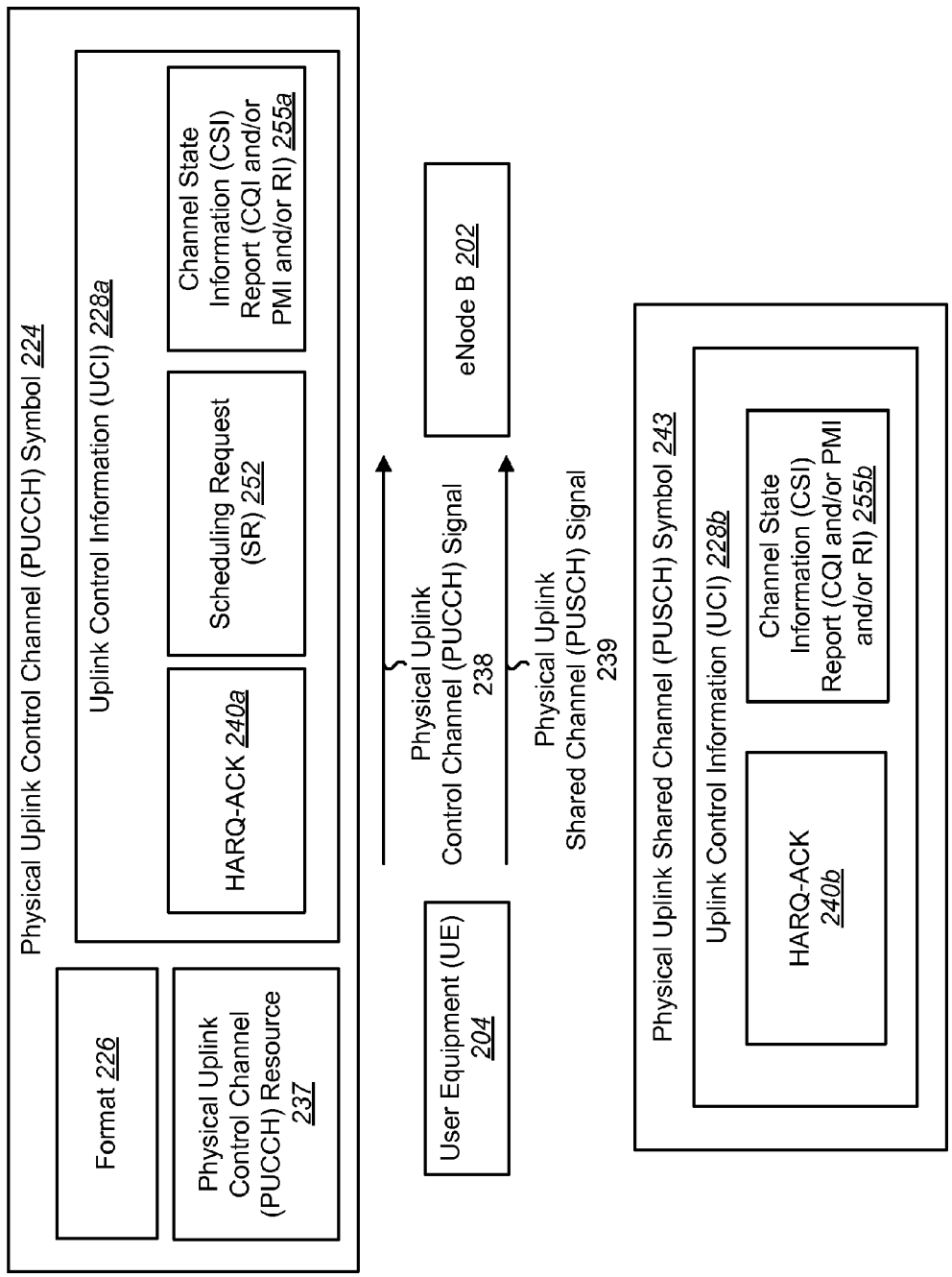
FIG. 2 is a block diagram illustrating transmissions from a user equipment (UE) to an eNode B during a subframe.

FIG. 2 is a block diagram illustrating transmissions from a user equipment (UE) 204 to an eNode B 202 during a subframe. The user equipment (UE) 204 may transmit a physical uplink control channel (PUCCH) symbol 224 via a physical uplink control channel (PUCCH) signal 238 to the eNode B 202. The user equipment (UE) 204 may also transmit a physical uplink shared channel (PUSCH) symbol 243 via a physical uplink shared channel (PUSCH) signal 239 to the eNode B 202. In one configuration, the user equipment (UE) 204 may simultaneously transmit a physical uplink control channel (PUCCH) symbol 224 and a physical uplink shared channel (PUSCH) symbol 243 to the eNode B 202.

The physical uplink control channel (PUCCH) symbol 224 may include uplink control information (UCI) 228*a*. The uplink control information (UCI) 228*a* may include an HARQ-ACK 240*a*. The uplink control information (UCI) 228*a* may also include a scheduling request (SR) 252. When a user equipment (UE) 204 has data to be transmitted and no physical uplink shared channel (PUSCH) is assigned, the user equipment (UE) 204 may generate a scheduling request (SR) 252. When a physical uplink shared channel (PUSCH) symbol 243 is already scheduled for transmission, the user equipment (UE) 204 does not generate a scheduling request (SR) 252. The uplink control information (UCI) 228*a* may include a periodic channel state information (CSI) report 255*a*. The channel state information (CSI) report 255*a* may include channel quality indicator (CQI) and/or precoding matrix indicator (PMI) and/or rank indication (RI). The rank indication (RI) is the number of useful transmission layers for a multiple-input and multiple-output (MIMO) transmission.

The physical uplink control channel (PUCCH) symbol 224 may further include a format 226 for which the physical uplink control channel (PUCCH) symbol 224 is transmitted. For example, the physical uplink control channel (PUCCH) symbol 224 may be transmitted using Format 1/1*a*/1*b*, Format 2/2*a*/2*b*, Format 3 or any other new formats. As used herein, Format 1/1*a*/1*b* represents Format 1 and/or Format 1*a* and/or Format 1 b. Also, as used herein, Format 2/2*a*/2*b* represents Format 2 and/or Format 2*a* and/or Format 2*b*. Herein, Format 3 represents the DFT-S-OFDM based format defined in Rel-10. For the present systems and methods, the format 226 may be Format 3.

The physical uplink control channel (PUCCH) symbol 224 may also include a physical uplink control channel (PUCCH) resource 237. The physical uplink control channel (PUCCH) resource 237 may be periodically pre-assigned by a higher layer 118, which uses Format 2/2*a*/2*b* to report the periodic channel state information (CSI) report and when simultaneous channel state information (CSI) and HARQ-ACK 240*a* reporting is configured. The physical uplink control channel (PUCCH) resource 237 may be dynamically linked to the physical downlink control channel (PDCCH) configuration and the physical downlink shared channel (PDSCH) transmission to report HARQ-ACK 240*a* using Format 1/1*a*/1*b* or Format 3.

The physical uplink shared channel (PUSCH) symbol 243 may also include uplink control information (UCI) 228*b*. The uplink control information (UCI) 228*b* may include the ACK/NACK information corresponding to the transmission of data in the downlink (such as an HARQ-ACK 240*b*) and a channel state information (CSI) report 255*b*. The channel state information (CSI) report 255*b* may be periodic channel state information (CSI) or aperiodic channel state information (CSI). The channel state information (CSI) report 255*b* may include channel quality indicator (CQI), and/or precoding matrix indicator (PMI) and/or rank indication (RI).

Figure 3:
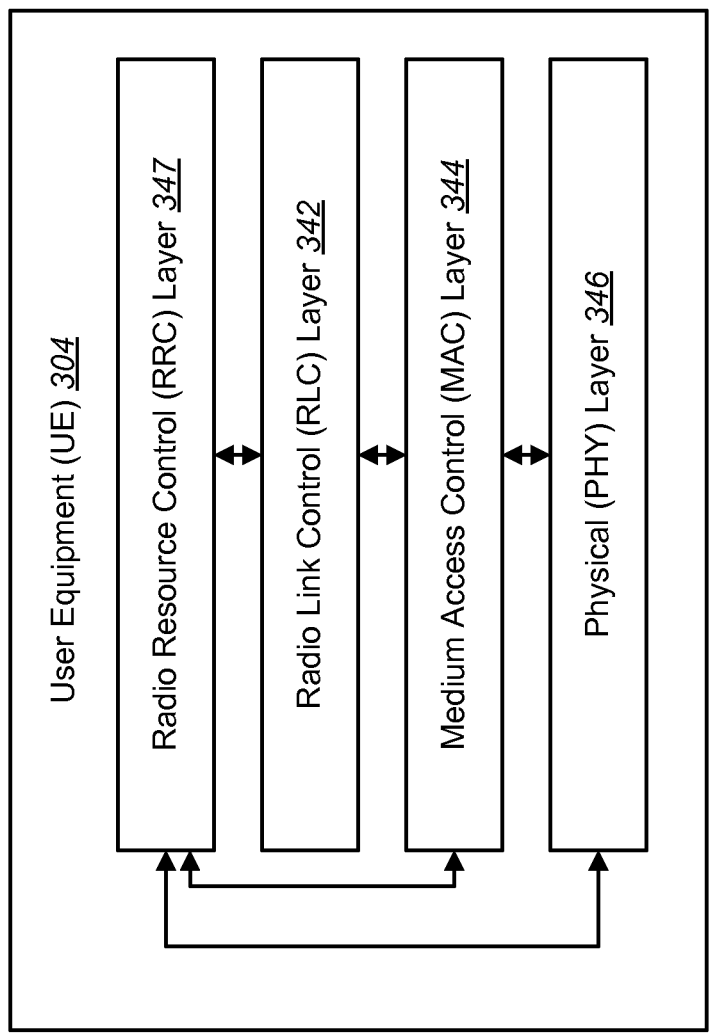
FIG. 3 is a block diagram illustrating the layers used by a user equipment (UE)

FIG. 3 is a block diagram illustrating the layers used by a user equipment (UE) 304. The user equipment (UE) 304 of FIG. 3 may be one configuration of the user equipment (UE) 104 of FIG. 1. The user equipment (UE) 304 may include a radio resource control (RRC) layer 347, a radio link control (RLC) layer 342, a medium access control (MAC) layer 344 and a physical (PHY) layer 346. These layers may be referred to as higher layers 118. The user equipment (UE) 304 may include additional layers not shown in FIG. 3.

Figure 4:
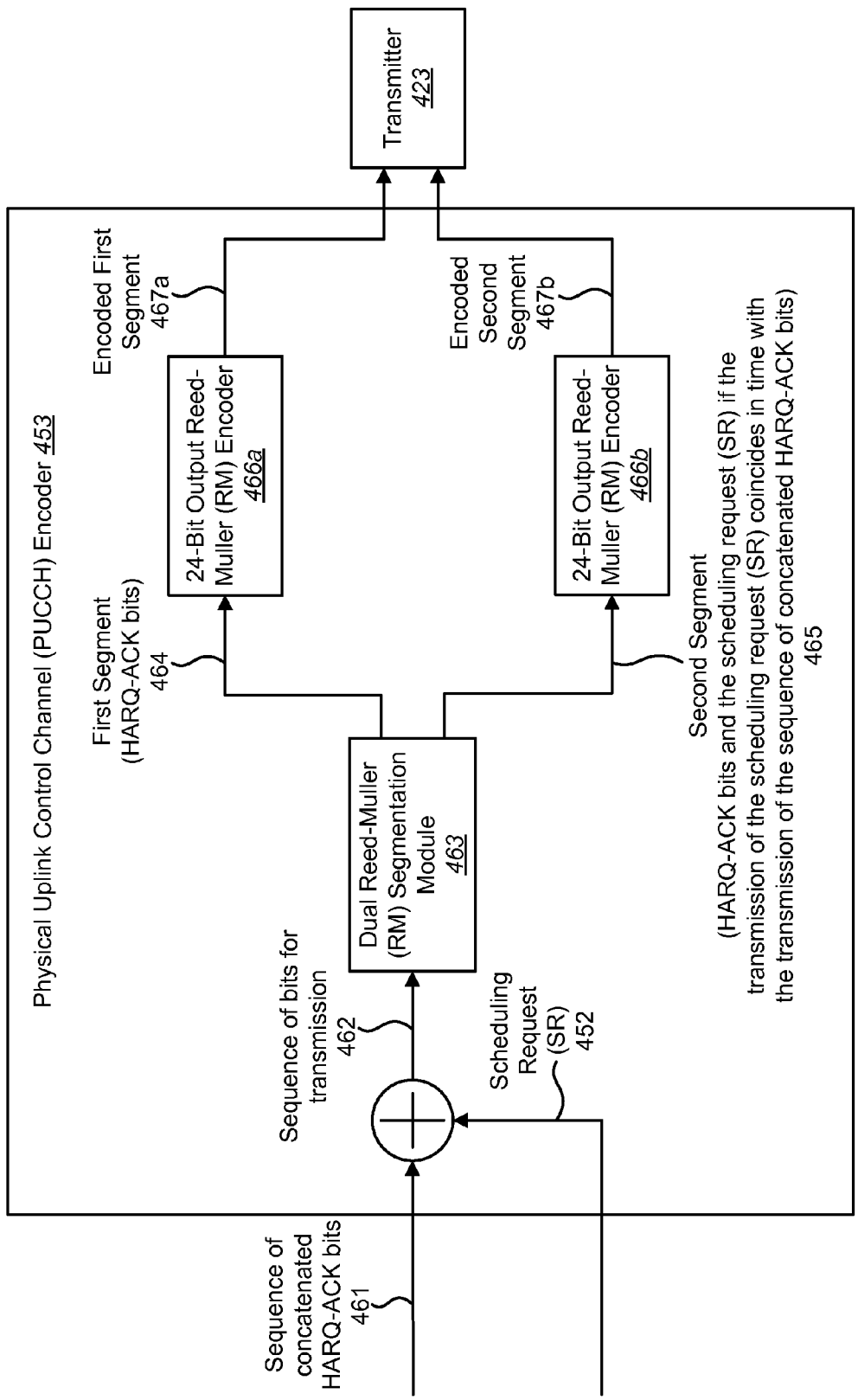
FIG. 4 is a block diagram illustrating a physical uplink control channel (PUCCH) encoder for use in the present systems and methods.

FIG. 4 is a block diagram illustrating a physical uplink control channel (PUCCH) encoder 453 for use in the present systems and methods. The physical uplink control channel (PUCCH) encoder 453 may use physical uplink control channel (PUCCH) Format 3 when the number of input bits is greater than 11 and less than or equal to 21. The physical uplink control channel (PUCCH) encoder 453 of FIG. 4 may be one configuration of the physical uplink control channel (PUCCH) encoder 153 of FIG. 1. The physical uplink control channel (PUCCH) encoder 453 may receive a sequence of concatenated HARQ-ACK bits 461 from an uplink control information (UCI) reporting module 114. The physical uplink control channel (PUCCH) encoder 453 may also receive a scheduling request (SR) 452 from the uplink control information (UCI) reporting module 114. As agreed in 3GPP meetings and in the current draft specification, if the transmission of a scheduling request (SR) 452 coincides in time with the transmission of HARQ-ACK feedback using physical uplink control channel (PUCCH) Format 3 (i.e., the sequence of concatenated HARQ-ACK bits 461), the scheduling request (SR) 452 is appended at the end of the sequence of concatenated HARQ-ACK bits 461.

The physical uplink control channel (PUCCH) encoder 453 may not always receive a scheduling request (SR) 452 that coincides in time with the HARQ-ACK feedback. The sequence of bits for transmission 462 may only include the scheduling request (SR) 452 when a scheduling request (SR) 452 is received that coincides in time with the HARQ-ACK feedback. A dual Reed-Muller (RM) segmentation module 463 may be used on the sequence of bits for transmission 462 to segment the sequence of bits for transmission 462 into a first segment 464 and a second segment 465. The first segment 464 may only include HARQ-ACK bits. The second segment 465 may include HARQ-ACK bits and the scheduling request (SR) 452 if the scheduling request (SR) 452 coincides in time with the transmission of the HARQ-ACK.

The number of bits in the sequence of bits for transmission 462 (including the possible concurrent transmission of a scheduling request (SR) 452) may be defined as $N_{A/N}^{PUCCH\ format\ 3}$. When $11 < N_{A/N}^{PUCCH\ format\ 3} \le 21$, the sequences of bits $\alpha_0, \alpha_1, \alpha_2, \ldots, \alpha\lceil N_{A/N}^{PUCCH\ format\ 3}/2\rceil-1$ and $\alpha\lceil N_{A/N}^{PUCCH\ format\ 3}/2\rceil, \alpha\lceil N_{A/N}^{PUCCH\ format\ 3}/2\rceil+1, \alpha\lceil N_{A/N}^{PUCCH\ format\ 3}/2\rceil+2, \ldots, \alpha N_{A/N}^{PUCCH\ format\ 3}-1$ are encoded using two independent Reed-Muller (RM) encoders 466a-b. Currently, a ceiling function is used to segment the sequence of bits for transmission to the two Reed-Muller (RM) encoders 466. The ceiling function $\lceil x \rceil$ returns the nearest integers greater than or equal to the input value x. Thus, the first segment 464 has a payload that is the same or 1 bit more than the payload of the second segment 465.

There is a potential bad ACK/NACK (A/N) segmentation issue when the total number of bits of the concatenated HARQ-ACK bits 461 is an even number and the scheduling request (SR) 452 is appended to the sequence of concatenated HARQ-ACK bits 461, thus making the total number of bits $N_{A/N}^{PUCCH\ format\ 3}$ for the sequence of bits for transmission 462 an odd number.

If the total number of bits in the sequence of bits for transmission 462 is an odd number (i.e., $N_{A/N}^{PUCCH\ format\ 3}=2k+1$), the sequence of bits for transmission 462 is segmented such that the first segment 464 may have k+1 bits and the second segment 465 may have k bits. In this case, the bit error probabilities may be defined as $e_1$ for the segment with a payload size of k+1 and $e_2$ for the segment with a payload size of k. Because there is a ~0.5 decibel (dB) loss with 1 bit of extra payload, $e_1 > e_2$.

If the total number of bits in the sequence of concatenated HARQ-ACK bits 461 is an odd number, and the scheduling request (SR) 452 is not included in the sequence of bits for transmission 462, the sequence of bits for transmission 462 is the same as the sequence of concatenated HARQ-ACK bits 461 and the number of bits of the sequence of bits for transmission is an odd number (i.e., $N_{A/N}^{PUCCH\ format\ 3}=2k+1$) and the expected bit error rate e for the A/N is found using Equation (1):

$$e = \frac{e_1(k+1) + e_2 k}{2k+1}. \quad (1)$$

If the number of bits in the sequence of concatenated HARQ-ACK bits 461 is an odd number (i.e., 2k+1), and the scheduling request (SR) 452 is appended to the sequence of concatenated HARQ-ACK bits 461, the number of bits of the sequence of bits for transmission 462 becomes an even number (i.e., $N_{A/N}^{PUCCH\ format\ 3}=2k+2$), the first segment 464 may have a payload of k+1 bits and the second segment 465 may have a payload of k+1 bits. The expected bit error rate for the scheduling request (SR) 452 is $e_1$ and the expected bit error rate e for the A/N is found using Equation (2):

$$e = \frac{e_1(k+1) + e_1 k}{2k+1} = e_1. \quad (2)$$

If the number of bits in the sequence of concatenated HARQ-ACK bits 461 is an even number (i.e., 2k), and the scheduling request (SR) 452 is not appended to the sequence of concatenated HARQ-ACK bits 461, the sequence of bits for transmission 462 is the same as the sequence of concatenated HARQ-ACK bits 461 and the number of bits in the sequence of bits for transmission 462 is an even number (i.e., $N_{A/N}^{PUCCH\ format\ 3}=2k$). The first segment 464 may then have k bits and the second segment 465 may have k bits. In this case, the expected bit error rate for the A/N is $e_2$.

If the number of bits in the sequence of concatenated HARQ-ACK bits 461 is an even number (i.e., 2k), and the scheduling request (SR) 452 is appended to the sequence of concatenated HARQ-ACK bits 461, the number of bits in the sequence of bits for transmission 462 becomes an odd number (i.e., $N_{A/N}^{PUCCH\ format\ 3}=2k+1$). The first segment 464 may then have k+1 bits and the second segment 465 may have k bits.

In this case, the first segment 464 has k+1 A/N bits and the second segment 465 has k−1 A/N bits and 1 bit of scheduling request (SR) 452. The used codeword space is different by 1 bit if SR=1. However, in most cases, SR=0 and the used codeword space differs by 2 (i.e., $2^{k+1}$ codeword space is used for the first segment 464 and $2^{k-1}$ codeword space is used for the second segment 465).

This may lead to a higher error probability for the A/N bits because more A/N bits are put into the segment 464 with the higher payload. On the other hand, the scheduling request (SR) 452 is always in the segment with the lower payload. This is contradictory with the desired performance criteria that has a higher performance requirement for A/N than for a scheduling request (SR) 452. In other words, the desired performance criteria is that the A/N have a lower expected bit error probability than the scheduling request (SR) 452. However, using the ceiling function (as is used in the current standard specification) produces an A/N with a higher expected bit error probability than the scheduling request (SR) 452. The bit error probability is $e_1$ for the first segment 464 with a payload size of k+1 and $e_2$ for the second segment 465 with a payload size of k. Again, because there is a ~0.5 decibel (dB) loss with 1 bit of extra payload, $e_1 > e_2$.

The expected bit error rate for the scheduling request (SR) 452 is $e_2$ and the expected bit error rate e for the A/N may be found using Equation (3):

$$e = \frac{e_1(k+1) + e_2(k-1)}{2k} = \frac{e_1 + e_2}{2} + \frac{e_1 - e_2}{2k}. \quad (3)$$

To overcome the above highlighted situation, and thus better match the desired performance requirements between HARQ-ACK and a scheduling request (SR) 452 for dual Reed-Muller (RM) encoders 466 on a payload size greater than 11 and less than or equal to 21, the ceiling function may be replaced with a floor function in the dual Reed-Muller (RM) segmentation module 463. The floor function in the dual Reed-Muller (RM) segmentation module 463 may be defined as $\lceil N_{A/N}^{PUCCH\ format\ 3}/2 \rceil$ that returns the nearest integers smaller than or equal to the input value $N_{A/N}^{PUCCH\ format\ 3}/2$.

When a floor function is used in the dual Reed-Muller (RM) segmentation module 463, if the number of bits in the sequence of concatenated HARQ-ACK bits 461 is an odd number and the scheduling request (SR) 452 is not appended to the sequence of concatenated HARQ-ACK bits 461, the sequence of bits for transmission 462 is the same as the sequence of concatenated HARQ-ACK bits 461 and the total number of bits in the sequence of bits for transmission 462 is an odd number (i.e., $N_{A/N}^{PUCCH\ format\ 3}$=2k+1). The first segment 464 may have k bits, the second segment 465 may have k+1 bits and the expected bit error rate e for the A/N is exactly the same as that for the ceiling function above in Equation (1).

When a floor function is used in the dual Reed-Muller (RM) segmentation module 463, if the number of bits in the sequence of concatenated HARQ-ACK bits 461 is an odd number (i.e., 2k+1) and the scheduling request (SR) 452 is appended to the sequence of concatenated HARQ-ACK bits 461, number of bits in the sequence of bits for transmission 462 becomes an even number (i.e., $N_{A/N}^{PUCCH\ format\ 3}$=2k+2). The first segment 464 may then have k+1 bits and the second segment 465 may have k+1 bits. The expected bit error rate for the scheduling request (SR) 452 is $e_1$ and the expected bit error rate e for the A/N is found using Equation (2) above. Thus, in cases where the number of A/N bits is an odd number, a ceiling function and a floor function 463 have the same complexity and error probability.

When a floor function is used in the dual Reed-Muller (RM) segmentation module 463, if the number of bits in the sequence of concatenated HARQ-ACK bits 461 is an even number (i.e., 2k) and the scheduling request (SR) 452 is not appended to the sequence of concatenated HARQ-ACK bits 461, the sequence of bits for transmission 462 is the same as the sequence of concatenated HARQ-ACK bits 461. Also, the number of bits in the sequence of bits for transmission 462 is an even number ($_{i.e.,\ NA/N}^{PUCCH\ format\ 3}$=2k), the first segment 464 may have k bits and the second segment 465 may have k bits. In this case, the expected bit error rate is $e_2$ for the A/N and the expected bit error rate for the scheduling request (SR) 452. This is the same complexity and error probability as that of the ceiling function.

When a floor function is used in the dual Reed-Muller (RM) segmentation module 463, if the number of bits in the sequence of concatenated HARQ-ACK bits 461 is an even number (i.e., 2k) and the scheduling request (SR) 452 is appended to the sequence of concatenated HARQ-ACK bits 461, the number of bits in the sequence of bits for transmission 462 becomes an odd number (i.e., $N_{A/N}^{PUCCH\ format\ 3}$=2k+1). The first segment 464 may then have k bits and the second segment 465 may have k+1 bits. In this case, the first segment 464 has k bits of A/N and the second segment 465 has k bits of A/N, leading to better A/N bit division. The second segment 465 has 1 extra bit for the scheduling request (SR) 452. If SR=1, the used codeword space is different by 1 bit. In most cases, where SR=0, the same codeword space is used ($2^k$).

Compared to using the ceiling function, using the floor function in the dual Reed-Muller (RM) segmentation module 463 has a lower error probability for the A/N. Furthermore, the scheduling request (SR) 452 is included in the segment with 1 bit of higher payload. Thus, the overall A/N performance is better than the scheduling request (SR) 452. This is a better match to the performance criteria. The bit error probabilities may be defined as $e_1$ for the first segment 464 with a payload size of k and $e_2$ for the second segment 465 with a payload size of k+1. The expected bit error rate e for the A/N may be found using Equation (4):

$$e = \frac{e_1 k + e_2 k}{2k} = \frac{e_1 + e_2}{2}. \quad (4)$$

The extra term $$\frac{e_1 - e_2}{2k}$$

that is in the expected bit error rate for the A/N with the ceiling function has thus been removed. The expected bit error rate for the scheduling request (SR) 452 is $e_1$.

When a floor function is used in the dual Reed-Muller (RM) segmentation module 463, the first segment 464 may include the sequences of bits $\alpha_0, \alpha_1, \alpha_2, \ldots, \lfloor N_{A/N}^{PUCCH\ format\ 3}/2 \rfloor - 1$, where $\lfloor N_{A/N}^{PUCCH\ format\ 3}/2 \rfloor$ is a floor function 463 that returns the nearest integer smaller than or equal to the input value $N_{A/N}^{PUCCH\ format\ 3}/2$. The second segment 465 may include the sequences of bits $\alpha \lceil N_{A/N}^{PUCCH\ format\ 3}/2 \rceil, \alpha \lceil N_{A/N}^{PUCCH\ format\ 3}/2 \rceil + 1, \alpha \lceil N_{A/N}^{PUCCH\ format\ 3}/2, \ldots, \alpha_{NA/N}^{PUCCH\ format\ 3} - 1$ The first segment 464 may be encoded using a 24-bit output Reed-Muller (RM) encoder 466a which is a puncture of (32, O) output. The first segment 464 may be encoded according to Equation (5):

$$\tilde{b}_i = \sum_{n=0}^{\lfloor N_{A/N}^{PUCCH\ format\ 3}/2 \rfloor - 1} (a_n \cdot M_{i,n}) \bmod 2. \quad (5)$$

Thus, $\tilde{b}_i$ is the encoded first segment 467a. In Equation (5), i=0, 1, 2, . . . , 23 and the basis sequences $M_{i,n}$ for the (32, O) code are found in Table 1 below. Table 1 is Table 5.2.2.6.4-1 of TS36.211.

TABLE 1

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |

TABLE 1-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

The second segment 465 may be encoded using a 24-bit output Reed-Muller (RM) encoder 466b which is a puncture of (32, O) output. The second segment 465 may be encoded according to Equation (6):

$$\tilde{\tilde{b}}_i = \sum_{n=0}^{N_{A/N}^{PUCCH\ format\ 3} - \lfloor N_{A/N}^{PUCCH\ format\ 3}/2 \rfloor - 1} \left( a_{\lfloor N_{A/N}^{PUCCH\ format\ 3}/2 \rfloor + n} \cdot M_{i,n} \right) \mod 2. \quad (6)$$

Thus, $\tilde{\tilde{b}}_i$ is the encoded second segment 467b. In Equation (6), i=0, 1, 2, . . . , 23 and the basis sequences $M_{i,n}$ for the (32, O) code are found in Table 1 above. The output bit sequence $b_0, b_1, b_2, \ldots, b_{B-1}$, where $B=4 \cdot N_{sc}^{RB}$, is obtained by the alternate concatenation of the bit sequences $\tilde{b}_0, \tilde{b}_1, \tilde{b}_2, \ldots, \tilde{b}_{23}$ and $\tilde{\tilde{b}}_0, \tilde{\tilde{b}}_1, \tilde{\tilde{b}}_2, \ldots,$ as $\tilde{\tilde{b}}_{23}$ as follows. Set i, j=0. While i<4 $N_{sc}^{RB}$, $b_i = \tilde{b}_j$, $b_{i+1} = \tilde{\tilde{b}}_{j+1}$ and $b_{i+2} = \tilde{\tilde{b}}_j$, $b_{i+3} = \tilde{\tilde{b}}_{j+1}$. i=i+4 and j=j+2. The encoded first segment 467a and the encoded second segment 467b may then be sent to a transmitter 423 for transmission to an eNode B 102.

Figure 5:
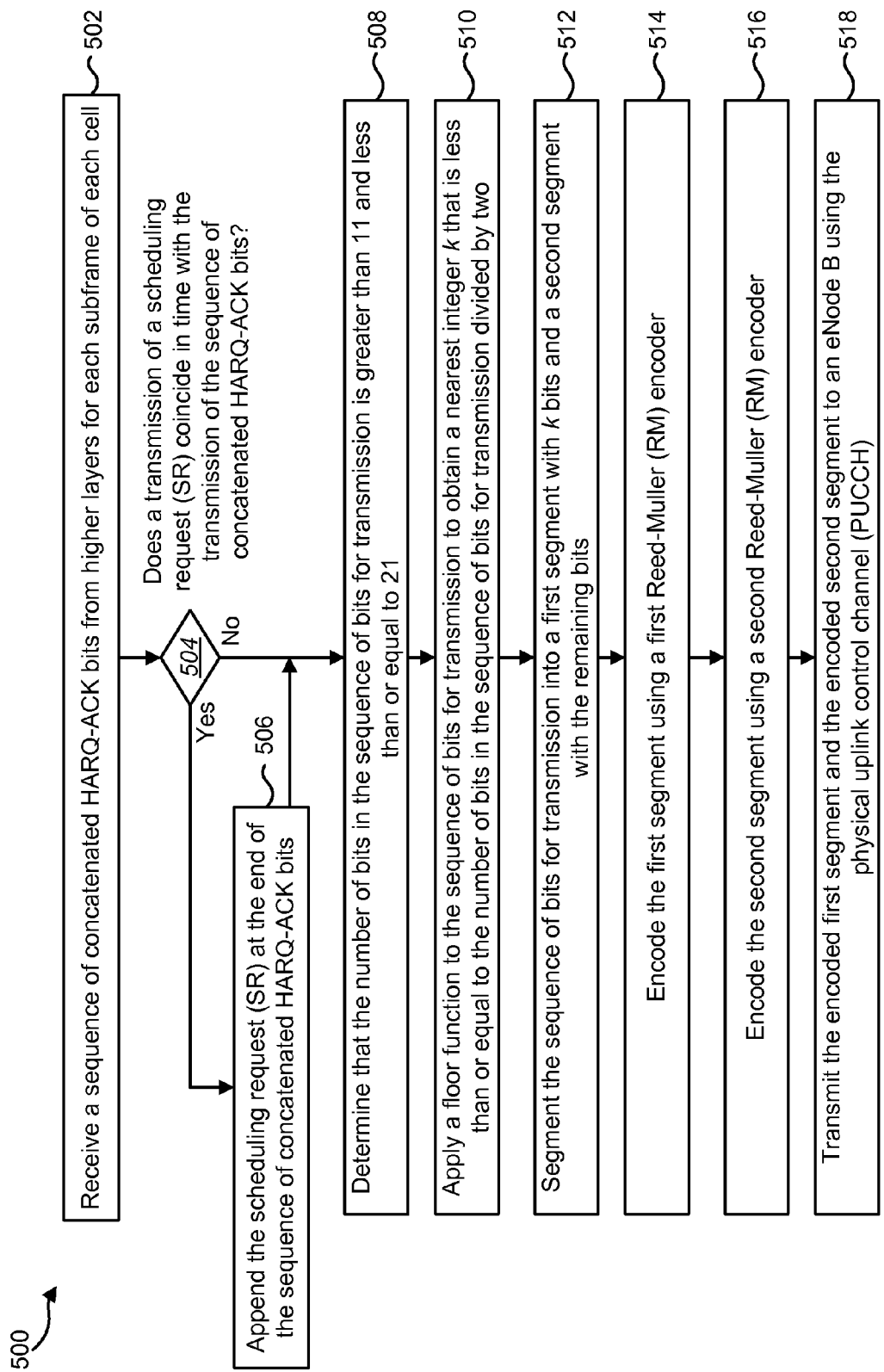
FIG. 5 is a flow diagram of a method for encoding a sequence of bits for transmission.

FIG. 5 is a flow diagram of a method 500 for encoding a sequence of bits for transmission 462. The method 500 may be performed by a user equipment (UE) 104. In one configuration, the method 500 may be performed by a physical uplink control channel (PUCCH) encoder 453 on the user equipment (UE) 104. The sequence of bits for transmission 462 may be uplink control information (UCI). The user equipment (UE) 104 may receive 502 a sequence of concatenated HARQ-ACK bits 461 from higher layers 118 for each subframe of each cell. The user equipment (UE) 104 may then determine 504 whether a transmission of a scheduling request (SR) 452 coincides in time with the transmission of the sequence of concatenated HARQ-ACK bits 461.

If a transmission of a scheduling request (SR) 452 coincides in time with the transmission of the sequence of concatenated HARQ-ACK bits 461, the user equipment (UE) 104 may append 506 the scheduling request (SR) 452 at the end of the sequence of concatenated HARQ-ACK bits 461 to form a sequence of bits for transmission 462. If a transmission of a scheduling request (SR) 452 does not coincide in time with the transmission of the sequence of concatenated HARQ-ACK bits 461, the user equipment (UE) 104 may use the sequence of concatenated HARQ-ACK bits 461 as the sequence of bits for transmission 462.

The user equipment (UE) 104 may determine 508 that the number of bits in the sequence of bits for transmission 462 is greater than 11 and less than or equal to 21. If the number of bits in the sequence of bits for transmission 462 is less than or equal to 11, only one Reed-Muller (RM) encoder 466 may be used and the method 500 does not apply. If the number of bits in the sequence of bits for transmission 462 is greater than 21, other encoders may be used and the method does not apply. This is because the maximum number of bits defined for physical uplink control channel (PUCCH) Format 3 is 21 bits (20 bits of A/N and 1 bit of scheduling request (SR)).

The user equipment (UE) 104 may apply 510 a floor function to the sequence of bits for transmission 462 to obtain a nearest integer k that is less than or equal to the number of bits in the sequence of bits for transmission 462 divided by two. The user equipment (UE) 104 may then segment 512 the bits of the sequence of bits for transmission 462 into a first segment 464 with k bits and a second segment 465 with the remaining bits. The second segment 465 may either have k bits or k+1 bits. If a scheduling request (SR) 452 coincides in time with transmission of the sequence of concatenated HARQ-ACK bits 461, the scheduling request (SR) 452 may be included within the second segment 465.

The user equipment (UE) 104 may encode 514 the first segment 464 using a first Reed-Muller (RM) encoder 466a. The user equipment (UE) 104 may also encode 516 the second segment 465 using a second Reed-Muller (RM) encoder 466b. The user equipment (UE) 104 may then transmit 518 the encoded first segment 467a and the encoded second segment 467b to an eNode B 102 using the physical uplink control channel (PUCCH).

Figure 6:
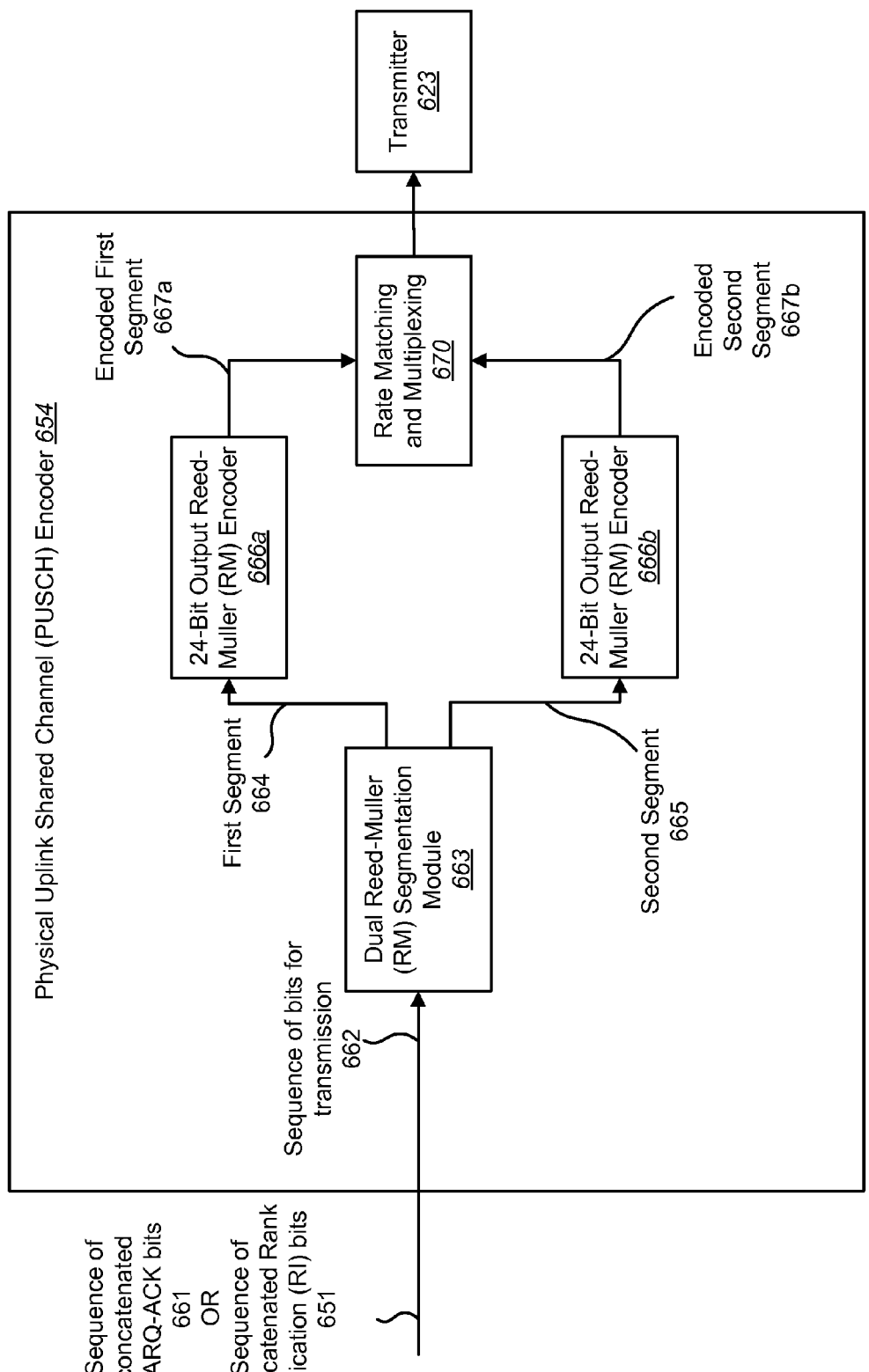
FIG. 6 is a block diagram illustrating a physical uplink shared channel (PUSCH) encoder for use in the present systems and methods.

FIG. 6 is a block diagram illustrating a physical uplink shared channel (PUSCH) encoder 654 for use in the present systems and methods. The physical uplink shared channel (PUSCH) encoder 654 of FIG. 6 may be one configuration of the physical uplink shared channel (PUSCH) encoder 154 of FIG. 1. The physical uplink shared channel (PUSCH) encoder 654 may receive a sequence of concatenated HARQ-ACK bits 661 from an uplink control information (UCI) reporting module 114. The physical uplink shared channel (PUSCH) encoder 654 may also receive a sequence of concatenated rank indication (RI) bits 651 from the uplink control information (UCI) reporting module 114. The concatenated rank indication (RI) bits 651 may be the rank indication (RI) bits of multiple component carriers (CCs) 108 or cells 185.

The sequence of concatenated HARQ-ACK bits 661 and the sequence of concatenated rank indication (RI) bits 651 may be coded and multiplexed separately on the physical uplink shared channel (PUSCH). Thus, the sequence of bits for transmission 662 may be either the sequence of concatenated HARQ-ACK bits 661 or the sequence of concatenated rank indication (RI) bits 651. If the number of bits in the sequence of concatenated HARQ-ACK bits 661 is greater than 11 bits and less than or equal to 20 bits, the same dual Reed-Muller (RM) coding method as is used for physical uplink control channel (PUCCH) Format 3 may be used for the sequence of bits for transmission 662, which is the sequence of concatenated HARQ-ACK bits 661. Similarly, if the number of bits in the sequence of concatenated rank indication (RI) bits 651 is greater than 11 bits and smaller or equal to 20 bits, the same dual Reed-Muller (RM) coding method as is used for physical uplink control channel (PUCCH) Format 3 may be used for the sequence of bits for transmission 662, which is the sequence of concatenated rank indication (RI) bits 651.

The current method in a dual Reed-Muller (RM) segmentation module 663 is a ceiling function. If a floor function is used in the dual Reed-Muller (RM) segmentation module 463 for the physical uplink control channel (PUCCH), for consistency, with uplink control information (UCI) multiplexing on the physical uplink shared channel (PUSCH), the floor function should also be used for the dual Reed-Muller (RM) segmentation module 663 to generate a first segment 664 and a second segment 665. A first 24-bit output Reed-Muller (RM) encoder 666a may generate an encoded first segment 667a from the first segment 664. A second 24-bit output Reed-Muller (RM) encoder 666b may generate an encoded second segment 667b from the second segment 665. Rate matching and multiplexing 670 may be performed on the encoded first segment 667a and the encoded second segment 667b to obtain a signal for transmission on the physical uplink shared channel (PUSCH) resource using the transmitter 623.

Figure 7:
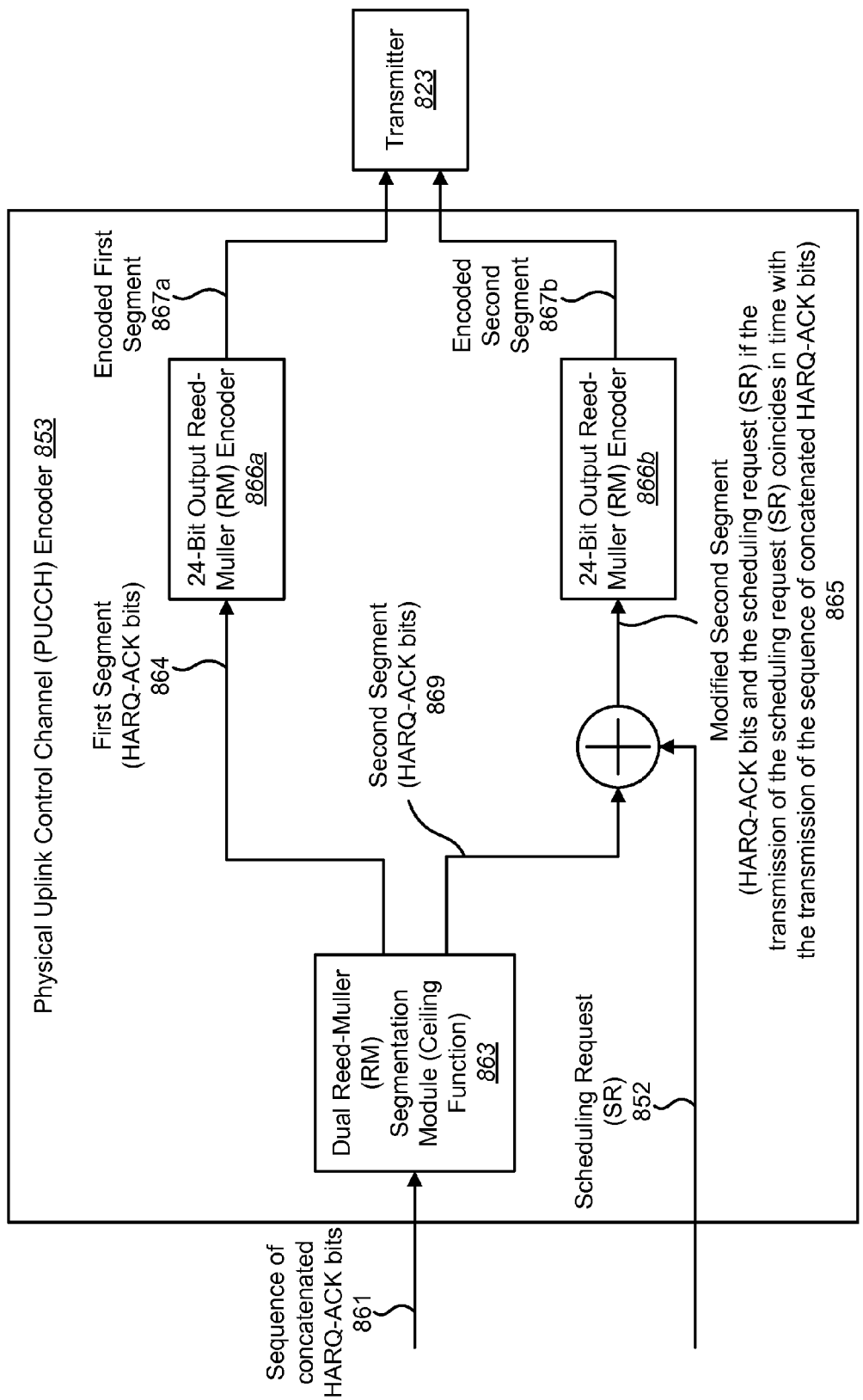
FIG. 7 is a block diagram illustrating another physical uplink control channel (PUCCH) encoder for use in the present systems and methods.

FIG. 7 is a block diagram illustrating another physical uplink control channel (PUCCH) encoder 853 for use in the present systems and methods. The physical uplink control channel (PUCCH) encoder 853 of FIG. 8 may be one configuration of the physical uplink control channel (PUCCH) encoder 153 of FIG. 1. The physical uplink control channel (PUCCH) encoder 853 may receive a sequence of concatenated HARQ-ACK bits 861 from an uplink control information (UCI) reporting module 114. The physical uplink control channel (PUCCH) encoder 853 may also receive a scheduling request (SR) 852 from the uplink control information (UCI) reporting module 114. As discussed above, it may be desirable that the sequence of concatenated HARQ-ACK bits 861 have a lower bit error rate than the scheduling request (SR) 852.

A dual Reed-Muller (RM) segmentation module 863 with a ceiling function may be used to segment the sequence of concatenated HARQ-ACK bits 861 into a first segment 864 and a second segment 869. The first segment 864 may include only HARQ-ACK 140 bits and the second segment 869 may include only HARQ-ACK 140 bits. The first segment 864 has either the same number of bits as the second segment 869 or one more bit than the second segment 869. If a scheduling request (SR) 852 coincides in time with the transmission of the sequence of concatenated HARQ-ACK bits 861, the scheduling request (SR) 852 may be appended at the end of the HARQ-ACK 140 bits of the second segment 869. Thus, the modified second segment 865 may then include the scheduling request (SR) 852 appended at the end of the HARQ-ACK 140 bits.

The first segment 864 may be encoded using a 24-bit output Reed-Muller (RM) encoder 866a, which is a puncture of (32, O) output. The first segment 864 may be encoded according to Equation (5) above. The modified second segment 865 may be encoded using a 24-bit output Reed-Muller (RM) encoder 866b, which is a puncture of (32, O) output. The modified second segment 865 may be encoded according to Equation (6) above. The encoded first segment 867a and the encoded second segment 867b may then be sent to a transmitter 823 for transmission to an eNode B 102 on the physical uplink control channel (PUCCH).

The physical uplink control channel (PUCCH) encoder 853 in FIG. 7 achieves the same Reed-Muller (RM) segmentation results as using a floor function in the dual Reed-Muller (RM) segmentation module 463. Thus, it also fixes the potential issue of using a ceiling function in the dual Reed-Muller (RM) segmentation module 463 when the number of bits in the sequence of concatenated HARQ-ACK bits 861 is an even number and a scheduling request (SR) 852 is appended. Furthermore, since the Reed-Muller (RM) segmentation is performed based on the sequence of concatenated HARQ-ACK bits 861 only, the segmentation of the HARQ-ACK 140 bits is the same as in the subframes where no scheduling request (SR) 852 resource is allocated. Thus, this prevents the unbalanced HARQ-ACK 140 segmentation issue on the physical uplink control channel (PUCCH) and no change is needed on the physical uplink shared channel (PUSCH).

Figure 8:
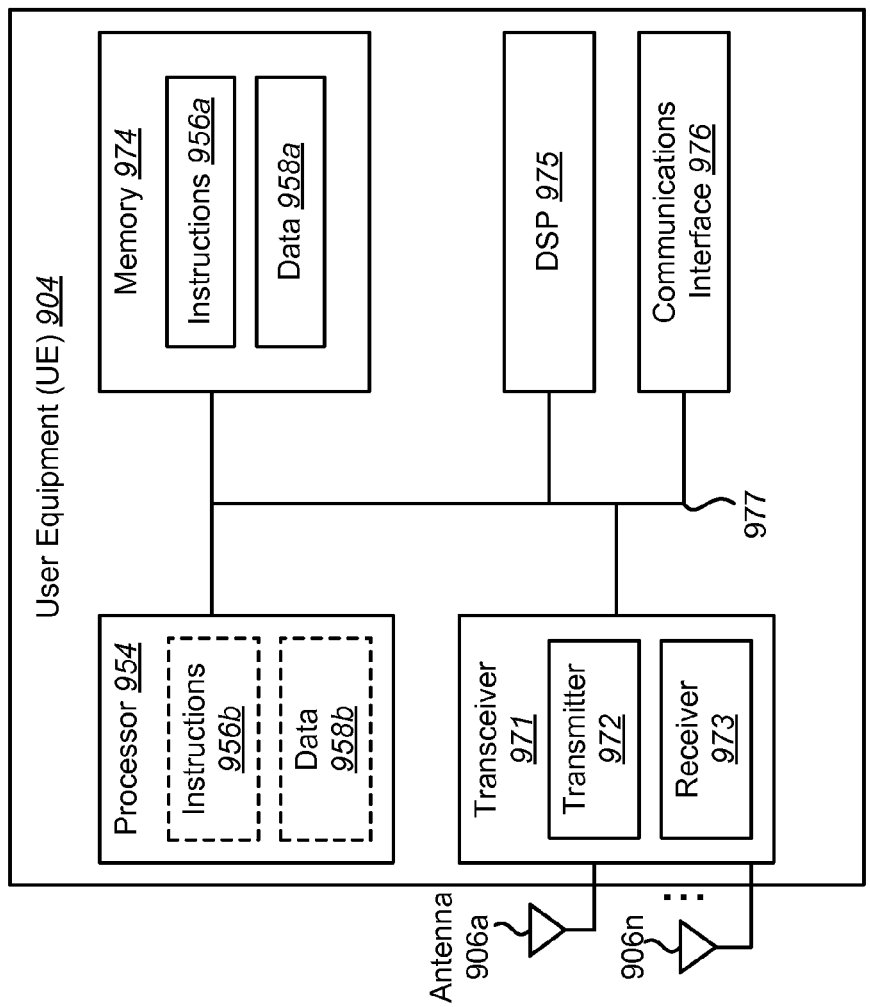
FIG. 8 illustrates various components that may be utilized in a user equipment (UE)

FIG. 8 illustrates various components that may be utilized in a user equipment (UE) 904. The user equipment (UE) 904 may be utilized as the user equipment (UE) 104 illustrated previously. The user equipment (UE) 904 includes a processor 954 that controls operation of the user equipment (UE) 904. The processor 954 may also be referred to as a CPU. Memory 974, which may include both read-only memory (ROM), random access memory (RAM) or any type of device that may store information, provides instructions 956a and data 958a to the processor 954. A portion of the memory 974 may also include non-volatile random access memory (NVRAM). Instructions 956b and data 958b may also reside in the processor 954. Instructions 956b and/or data 958b loaded into the processor 954 may also include instructions 956a and/or data 958a from memory 974 that were loaded for execution or processing by the processor 954. The instructions 956b may be executed by the processor 954 to implement the systems and methods disclosed herein.

The user equipment (UE) 904 may also include a housing that contains a transmitter 972 and a receiver 973 to allow transmission and reception of data. The transmitter 972 and receiver 973 may be combined into a transceiver 971. One or more antennas 906a-n are attached to the housing and electrically coupled to the transceiver 971.

The various components of the user equipment (UE) 904 are coupled together by a bus system 977, which may include a power bus, a control signal bus, and a status signal bus, in addition to a data bus. However, for the sake of clarity, the various buses are illustrated in FIG. 8 as the bus system 977. The user equipment (UE) 904 may also include a digital signal processor (DSP) 975 for use in processing signals. The user equipment (UE) 904 may also include a communications interface 976 that provides user access to the functions of the user equipment (UE) 904. The user equipment (UE) 904 illustrated in FIG. 8 is a functional block diagram rather than a listing of specific components.

Figure 9:
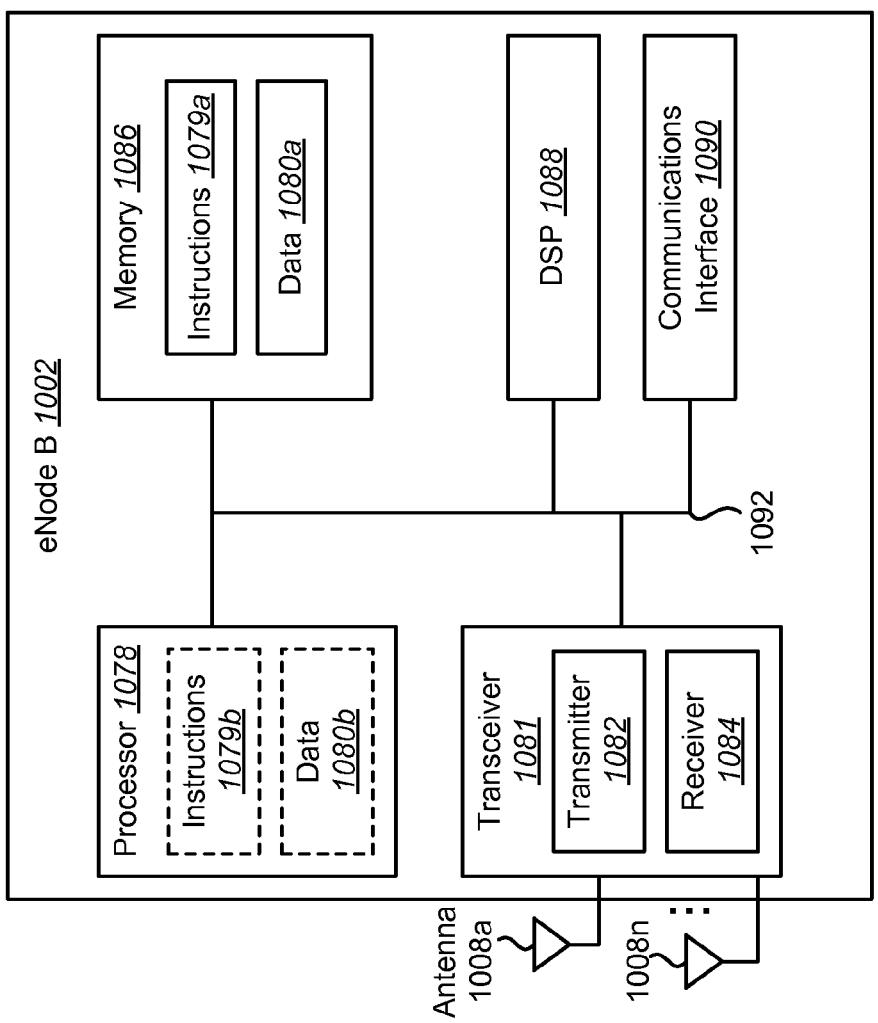
FIG. 9 illustrates various components that may be utilized in an eNode B.

FIG. 9 illustrates various components that may be utilized in an eNode B 1002. The eNode B 1002 may be utilized as the eNode B 102 illustrated previously. The eNode B 1002 may include components that are similar to the components discussed above in relation to the user equipment (UE) 904, including a processor 1078, memory 1086 that provides instructions 1079a and data 1080a to the processor 1078, instructions 1079b and data 1080b that may reside in or be loaded into the processor 1078, a housing that contains a transmitter 1082 and a receiver 1084 (which may be combined into a transceiver 1081), one or more antennas 1008a-n electrically coupled to the transceiver 1081, a bus system 1092, a DSP 1088 for use in processing signals, a communications interface 1090 and so forth.

Unless otherwise noted, the use of '/' above represents the phrase "and/or."

The functions described herein may be implemented in hardware, software, firmware or any combination thereof. If implemented in software, the functions may be stored as one or more instructions on a computer-readable medium. The term "computer-readable medium" refers to any available medium that can be accessed by a computer or a processor. The term "computer-readable medium," as used herein, may denote a computer- and/or processor-readable medium that is non-transitory and tangible. By way of example, and not limitation, a computer-readable or processor-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Each of the methods disclosed herein comprises one or more steps or actions for achieving the described method. The method steps and/or actions may be interchanged with one another and/or combined into a single step without departing from the scope of the claims. In other words, unless a specific order of steps or actions is required for proper operation of the method that is being described, the order and/or use of specific steps and/or actions may be modified without departing from the scope of the claims.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory may be integral to a processor and still be said to be in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

Software or instructions may also be transmitted over a transmission medium. For example, if the software is transmitted from a website, server, or other remote source using a coaxial cable, fiber optic cable, twisted pair, digital subscriber line (DSL) or wireless technologies such as infrared, radio, and microwave, then the coaxial cable, fiber optic cable, twisted pair, DSL, or wireless technologies such as infrared, radio and microwave are included in the definition of transmission medium.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A method for reporting uplink control information (UCI) on a user equipment (UE), comprising:
 determining that a number of bits in a sequence of bits for transmission is greater than 11 and less than or equal to 21;
 segmenting the sequence of bits for transmission into a first segment and a second segment using a floor function;
 encoding the first segment using a first Reed-Muller encoder; and
 encoding the second segment using a second Reed-Muller encoder.

2. The method of claim 1, further comprising transmitting the encoded first segment and the encoded second segment on the physical uplink control channel (PUCCH).

3. The method of claim 1, further comprising transmitting the encoded first segment and the encoded second segment on the physical uplink shared channel (PUSCH).

4. The method of claim 1, wherein the sequence of bits for transmission comprises a concatenated sequence of hybrid automatic repeat request acknowledgement (HARQ-ACK) bits.

5. The method of claim 1, wherein a scheduling request (SR) coincides with the transmission of a sequence of concatenated hybrid automatic repeat request acknowledgement (HARQ-ACK) bits, and further comprising appending the scheduling request (SR) at the end of the sequence of concatenated HARQ-ACK bits to obtain the sequence of bits for transmission.

6. The method of claim 5, further comprising transmitting the encoded first segment and the encoded second segment to an eNode B using physical uplink control channel (PUCCH) Format 3.

7. The method of claim 5, wherein a bit error rate of the scheduling request (SR) is greater than a bit error rate of the HARQ-ACK bits.

8. The method of claim 1, further comprising receiving a sequence of concatenated hybrid automatic repeat request acknowledgement (HARQ-ACK) bits from higher layers for each subframe of each cell.

9. A method for reporting uplink control information (UCI) on a user equipment (UE), comprising:
   determining that a number of bits in a sequence of bits for transmission is greater than 11 and less than or equal to 21;
   segmenting the sequence of bits for transmission into a first segment and a second segment using a ceiling function;
   encoding the first segment using a first Reed-Muller encoder;
   encoding the second segment using a second Reed-Muller encoder; and
   rate matching and multiplexing the encoded first segment and the encoded second segment.

10. The method of claim 9, wherein the sequence of bits for transmission comprises a sequence of concatenated hybrid automatic repeat request acknowledgement (HARQ-ACK) bits.

11. The method of claim 9, wherein the sequence of bits for transmission comprises a sequence of concatenated rank indication (RI) bits.

12. The method of claim 9, further comprising transmitting the encoded first segment and the encoded second segment on the physical uplink shared channel (PUSCH) after rate matching and multiplexing the encoded first segment and the encoded second segment.

13. A user equipment (UE) configured for reporting uplink control information (UCI), comprising:
   a processor;
   memory in electronic communication with the processor;
   instructions stored in the memory, the instructions being executable to:
      determine that a number of bits in a sequence of bits for transmission is greater than 11 and less than or equal to 21;
      segment the sequence of bits for transmission into a first segment and a second segment using a floor function;
      encode the first segment using a first Reed-Muller encoder; and
      encode the second segment using a second Reed-Muller encoder.

14. The UE of claim 13, wherein the instructions are further executable to transmit the encoded first segment and the encoded second segment on the physical uplink control channel (PUCCH).

15. The UE of claim 13, wherein the instructions are further executable to transmit the encoded first segment and the encoded second segment on the physical uplink shared channel (PUSCH).

16. The UE of claim 13, wherein the sequence of bits for transmission comprises a concatenated sequence of hybrid automatic repeat request acknowledgement (HARQ-ACK) bits.

17. The UE of claim 13, wherein a scheduling request (SR) coincides with the transmission of a sequence of concatenated hybrid automatic repeat request acknowledgement (HARQ-ACK) bits, and wherein the instructions are further executable to append the scheduling request (SR) at the end of the sequence of concatenated HARQ-ACK bits to obtain the sequence of bits for transmission.

18. The UE of claim 17, wherein the instructions are further executable to transmit the encoded first segment and the encoded second segment to an eNode B using physical uplink control channel (PUCCH) Format 3.

19. The UE of claim 17, wherein a bit error rate of the scheduling request (SR) is greater than a bit error rate of the HARQ-ACK bits.

20. The UE of claim 13, wherein the instructions are further executable to receive a sequence of concatenated hybrid automatic repeat request acknowledgement (HARQ-ACK) bits from higher layers for each subframe of each cell.

21. A user equipment (UE) configured for reporting uplink control information (UCI), comprising:
   a processor;
   memory in electronic communication with the processor;
   instructions stored in the memory, the instructions being executable to:
      determine that a number of bits in a sequence of bits for transmission is greater than 11 and less than or equal to 21;
      segment the sequence of bits for transmission into a first segment and a second segment using a ceiling function;
      encode the first segment using a first Reed-Muller encoder;
      encode the second segment using a second Reed-Muller encoder; and
      rate match and multiplex the encoded first segment and the encoded second segment.

22. The UE of claim 21, wherein the sequence of bits for transmission comprises a sequence of concatenated hybrid automatic repeat request acknowledgement (HARQ-ACK) bits.

23. The UE of claim 21, wherein the sequence of bits for transmission comprises a sequence of concatenated rank indication (RI) bits.

24. The UE of claim 21, wherein the instructions are further executable to transmit the encoded first segment and the encoded second segment on the physical uplink shared channel (PUSCH) after rate matching and multiplexing the encoded first segment and the encoded second segment.

* * * * *

UNITED STATES PATENT AND TRADEMARK OFFICE
CERTIFICATE OF CORRECTION

PATENT NO.        : 8,549,374 B2                                              Page 1 of 1
APPLICATION NO.   : 13/026073
DATED             : October 1, 2013
INVENTOR(S)       : Zhanping Yin et al.

It is certified that error appears in the above-identified patent and that said Letters Patent is hereby corrected as shown below:

In the Specification

In column 3, line 40 please delete "a down link" and replace it with --a downlink--.

In column 3, line 42 please delete "The down link" and replace it with --The downlink--.

Signed and Sealed this
Eighteenth Day of March, 2014

Michelle K. Lee
*Deputy Director of the United States Patent and Trademark Office*